United States Patent [19]
Harmon et al.

[11] Patent Number: 5,686,345
[45] Date of Patent: Nov. 11, 1997

[54] TRENCH MASK FOR FORMING DEEP TRENCHES IN A SEMICONDUCTOR SUBSTRATE, AND METHOD OF USING SAME

[75] Inventors: David Laurant Harmon, Essex Junction; Nancy Tovey Pascoe, South Burlington, both of Vt.; John Francis Rembetski, Austin, Tex.; Pai-Hung Pan, Boise, Id.

[73] Assignee: International Business Machines Corporation, Armonk, N.Y.

[21] Appl. No.: 593,944

[22] Filed: Jan. 30, 1996

[51] Int. Cl.[6] ................................................ H01L 21/76
[52] U.S. Cl. ........................... 437/67; 437/73; 156/643.1; 148/DIG. 50

[58] Field of Search ................. 437/67, 73; 156/643.1; 148/DIG. 50

[56] References Cited

U.S. PATENT DOCUMENTS 5,008,210  4/1991  Chiang et al. ........................... 437/67
5,118,384  6/1992  Harmon et al. ....................... 756/643.1

Primary Examiner—Trung Dang
Attorney, Agent, or Firm—Whitham, Curtis, Whitham & McGinn; Dale M. Crockatt, Esq.

[57] ABSTRACT

A method for forming high aspect ratio, deep trenches in a semiconductor substrate with a composite etch mask structure including a thermally grown oxide surface layer as a plasma etch mask.

19 Claims, 2 Drawing Sheets

TRENCH MASK FOR FORMING DEEP TRENCHES IN A SEMICONDUCTOR SUBSTRATE, AND METHOD OF USING SAME

BACKGROUND OF THE INVENTION

1. Field of the Invention

The invention relates to trench mask structure useful for manufacture of high aspect ratio, deep trenches in semiconductor devices.

2. Description of the Related Art

High aspect ratio trench formation in integrated circuit fabrication generally involves reactive ion etching ("RIE") processing with directionality and high selectivity (i.e., etch rate of mask layer(s) compared to silicon substrate). However, the RIE process has been limited in conventional trench structure schemes by the physical sputter removal of the mask corners bounding the entrance to the recess or trench being formed; a phenomenon known as "faceting". This faceting often manifests itself as a beveling off of the etch mask corners. A problem arises when the extent of beveling is so great that the portions of the underlying layer adjacent the mask hole ultimately become exposed and eroded during the trench etch operation. This erosion of the layer underlying the RIE etch mask layer is undesirable especially when the underlying layer needs to have its integrity preserved for its function(s) in processing steps following the deep trench etch.

U.S. Pat. No. 4,830,981 (Baglee et al.) describes a method of making a dynamic one-transistor read/write memory cell employing a trench capacitor to increase the magnitude of the stored charge. An oxide-nitride sandwich is formed on a silicon slice and then patterned by photolithographic steps, leaving an exposed area for a bit line and an area where the capacitor will be formed. A trench etch mask of silicon dioxide is formed by low pressure chemical vapor deposition (LPCVD). Alternatively, a photoresist can be used if the etch selectivity of silicon to the photoresist is high enough. The oxide-nitride sandwich is not used as part of the etch mask to define the trench itself. A trench is created in the capacitor region using the LPCVD silicon dioxide mask by anisotropic etch, such as RIE, to a depth of about three microns and a one micron width (i.e., an aspect ratio of about 3:1).

U.S. Pat. No. 4,666,556 (Fulton et al.) teaches a method for thermally growing a conformal polysilicon oxide layer on the surface(s) of a groove. A triple layer mask structure is used to define the areas in the surface of the silicon substrate where the grooves or trenches are to be formed. This triple layer mask structure is a silicon dioxide/silicon nitride/CVD oxide scheme. The silicon dioxide pad is described as a buffer for the stress induced by the silicon nitride middle layer on the substrate, while the nitride layer serves as an oxidation mask and also as a polish-stop indicator for planarization during later operations. The CVD oxide serves, among other things, as a mask during the trench etching step itself. The triple layer mask is patterned according to the desired trench etch pattern using conventional lithographic and etching techniques. The trench pattern is then formed in the substrate by RIE, and then a polysilicon oxide trench liner is formed on the trench walls, followed by trench filling, planarization, and finishing steps. Similar in some respects to the Fulton et al. patent, U.K. Patent Application No. 2 200 794 (Roberts) discloses a method for etch definition of a trench in a single crystal silicon substrate with the trench defined by a mask structure involving a thin thermally grown oxide at the surface of the silicon substrate; a thin silicon nitride layer deposited on the thin oxide layer; and, optionally, a thick silicon oxide masking layer is deposited (not grown) on the silicon nitride layer. The masking layer is patterned photolithographically to define the trench mask, and the composite is then dry etched to define a trench in the silicon substrate. The thick deposited silicon dioxide masking layer is then removed by wet etch, and a polysilicon oxide trench wall liner is formed.

U.S. Pat. No. 4,238,278 (Antipov) describes a method for making shallow and deep recessed oxide isolation trenches in silicon semiconductor substrates where a trench mask structure is used involving a silicon oxide layer either thermally grown or deposited on the silicon substrate and a silicon nitride layer that is deposited upon the silicon dioxide layer. The deep trenches are formed by reactively ion etching exposed portions of the silicon substrate through the patterned silicon dioxide/silicon nitride etch mask, followed by oxidizing the trench surfaces and filling of the trenches. The use of silicon nitride as the etch mask would not allow for achieving relatively high aspect ratios in the trenches formed.

The use of a thermal grown silicon dioxide layer singly as a trench etch mask is described variously in U.S. Pat. Nos. 4,726,879 (Bondur et al.); 4,331,708 (Hunter); and 4,717, 448 (Cox et al.). For example, of these, U.S. Pat. No. 4,726,879 (Bondur et al.) uses a thermally grown silicon dioxide film as an RIE etch mask for silicon, but no oxide/nitride mask pad structure is used in combination with the thermal oxide film. This is significant because the absence of the nitride layer being available as an oxidation barrier, makes it difficult to apply the trench structure formed by the Bondur et al. methodology. Also, the Bondur et al. patent, which is commonly assigned, only provides trenches with an aspect ratio of about 4:1.

Despite the many and varied schemes for trench etch mask structures, such as exemplified by those discussed above, there still remains a need for a trench mask structure and process that reduces facet effect in the etch mask, provides trenches with high aspect ratios, reduces or eliminates wet etch requirements, and that allows for a thinner etch mask to be used.

SUMMARY OF THE INVENTION

It is an object of the present invention to provide a trench mask structure endowed with high resistance to faceting which allows formation in semiconductor substrates of deep trenches having high aspect ratios.

It is another object of the invention to provide a trench etch mask that permits use of dry etch stripping of the etch mask after its use in the trench etch so as to reduce wet etch requirements and the risk of mask pad undercutting and lift-off problems.

It is yet another object of the invention to provide a trench etch mask that permits use of a thin overall etch mask in deep trench formation.

The foregoing and other objects of the invention are realized by use of an etch mask structure including a thermally grown oxide surface layer as a plasma etch mask for forming deep trenches in a semiconductor substrate, such as a silicon substrate. It has been discovered that the thermally grown oxide surface layer is significantly more facet resistant at the mask corners when subjected to dry etching for deep trench formation as compared to oxide mask layers formed by other techniques, such as CVD oxide. Consequently, the mask structure of this invention allows for the formation in silicon substrates of deep trenches having high aspect ratios of greater than 10:1 in submicron geometries including those involving a very narrow spacing between trenches of less than 0.5 μm, and more particularly inclusive of about 0.4 μm geometries.

The thermally grown oxide layer preferably is used in the mask structure in combination with a pad sub-structure involving a silicon dioxide layer formed on the silicon substrate and a silicon nitride layer, that, in turn, has been deposited on the silicon dioxide layer. The thermally grown oxide layer is formed over the silicon nitride layer.

In one preferred embodiment of the invention, the thermal oxide layer in the trench mask of the invention is a layer of thermally grown silicon oxide. From a practical standpoint, a source of material must be provided on the silicon nitride layer of the mask structure from which to thermally grow a silicon oxide layer. An advantage of polycrystalline silicon ("polysilicon") is that a native oxide can be grown on its surface. Taking advantage of this attribute, in one particular embodiment of the invention, a polysilicon layer is formed on the silicon nitride layer of the mask structure, and then an oxide film is grown from the polysilicon layer by maintaining the composite intermediate wafer device in an elevated temperature in an oxidizing ambient, such as dry oxygen or water vapor. The thermal oxidation of the polysilicon layer forms a layer of polysilicon oxide overlying on any remaining thickness of the polysilicon. For purposes of this invention, "thermal oxidation" means an oxide film is grown on a surface by maintaining it in an elevated temperature in an oxidizing ambient, such as dry oxygen, water vapor, or combined usages thereof. Also, as used herein the phrase "polysilicon oxide" means oxide obtained by complete thermal oxidation of polysilicon material.

The extent of the thermal oxidation effected through the thickness of the polysilicon layer (from the exposed surface downward) generally is a nonzero value between 0% and 100% based on the percentage of the original thickness of the polysilicon that is transformed to polysilicon oxide. As a minimum amount of conversion, an adequate thickness of polysilicon oxide is grown to avoid complete erosion of the oxide mask layer during dry etching of the deep trenches in the silicon substrate. Preferably, at least a predominant (i.e., >50%) portion, but less than 100%, as measured in the thickness direction, of the polysilicon layer is transformed into polysilicon oxide by thermal oxidation.

The present invention encompasses dry etch formation of trenches with relatively high aspect ratios (e.g., aspect ratios greater than 10:1), which makes it difficult to strip the oxide etch mask layer by conventional wet etch methods alone (e.g. hydrofluoric acid dip). As a consequence, the silicon oxide layer tends to erode from its exposed surfaces at the trench wall during a prolonged wet etch of this type, leading to undercutting of the mask and increasing the risk of pad nitride lift-off problems. The present invention can avoid this lift-off problem with its capability to employ dry etching techniques as the primary mode of oxide mask removal.

It can be difficult to provide favorable dry etch selectivities with preference to polysilicon oxide versus silicon nitride in particular, such as during a dry etch stripping of the thermal oxide etch mask layer after trench formation. The present invention solves this problem by leaving a portion of the polysilicon layer in its original non-oxidized form to provide an dry etch stop for stripping the thermal oxide layer. Favorable dry etch chemistries that are preferential for thermal silicon oxide relative to polysilicon are more accessible.

In one preferred arrangement, approximately 70% of the original thickness of the polysilicon film is thermally oxidized, leaving approximately 30% of the original thickness of the polysilicon layer intact beneath the formed polysilicon oxide layer as untransformed and available as a dry etch stop during dry stripping of the polysilicon oxide layer. After the deep trenches are etched in the silicon substrate using this mask arrangement, the polysilicon oxide mask can then be removed primarily with a dry etch (e.g., an RIE process) that preferentially etches silicon oxide more rapidly as compared to polysilicon. This accommodation of dry stripping techniques as the primary mode of removal of the polysilicon oxide etch mask after trench formation represents an important advantage of the present invention.

BRIEF DESCRIPTION OF THE DRAWINGS

The foregoing and other objects, aspects and advantages will be better understood from the following detailed description of the preferred embodiments of the invention with reference to the drawings, in which.

DETAILED DESCRIPTION OF THE PREFERRED EMBODIMENTS OF THE INVENTION

The trench mask structure of this invention is used to form deep trenches as holes etched into a silicon substrate by an anisotropic etch technique, such as reactive ion etching (RIE). The trenches formed using the inventive trench mask structure have high aspect ratios that exceed 10:1 in sub 0.5 μm geometries.

Figure 1:
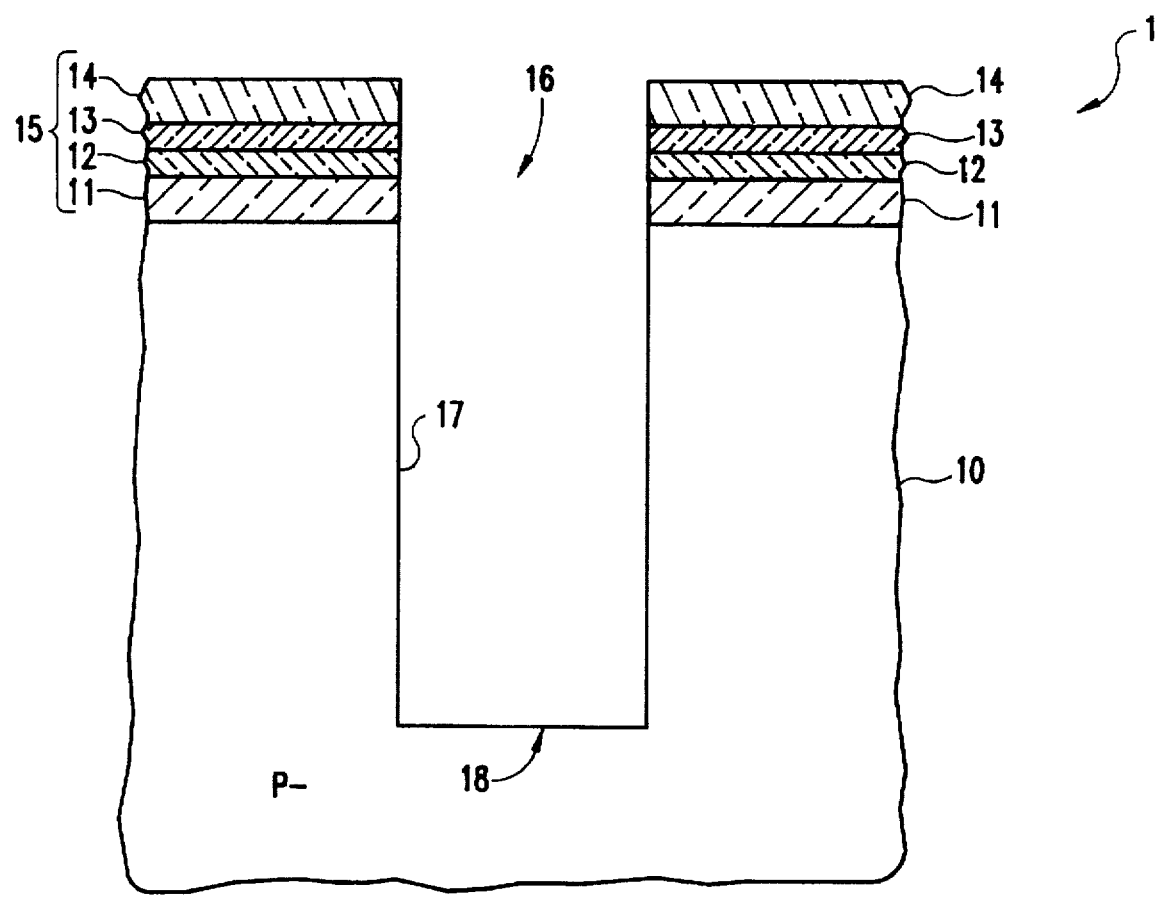
FIG. 1 illustrates in cross-sectional representation RIE of silicon using a trench mask structure and process in accordance with the invention to form high aspect ratio, deep trenches having vertical walls and a width identical to that of the opening in the non-faceted RIE mask.

Referring now to the drawings, and FIG. 1 in particular, there is shown a representative portion of a semiconductor structure 1 in cross-section including a monocrystalline silicon substrate 10 which is shown as P-conductivity for illustration purposes. The P type silicon substrate is used as an example only, as the type of substrate can be altered to N type. Moreover, it will be understood by one of skill that in some applications diffusion or ion implantation of ions of opposite conductivity into the surface regions of the silicon substrate 10 by known techniques will be warranted, but these features do not form part of the present invention and thus are not described herein in detail. Also, while this invention may be exemplified in terms of a silicon substrate, it will be understood that the present process can be applied to other semiconductor substrates for fabricating trench isolation and the like. Also, the drawings are not necessarily to scale, as the thicknesses of the various layers are shown for clarity of illustration and should not be interpreted in a limiting sense.

As illustrated in FIG. 1, starting with the P type silicon substrate 10, a multi-layered composite etch mask structure 15 is formed thereon including, in this sequence, an about 10 to 20 nm thick silicon dioxide layer 11, an about 100 to 200 nm thick silicon nitride 12, an about 50 to 100 nm thick polysilicon layer 13, and an about 300 to 600 nm thick polysilicon oxide layer 14.

The silicon dioxide layer 11 can be formed by any one of a number of known techniques, such as oxidation of the wafer by exposure to steam or dry oxygen at high temperature, chemical vapor deposition, LPCVD methods involving pyrolytic oxidation of alkoxy silanes such as TEOS (tetraethylorthosilane), and so forth.

The silicon nitride layer 12 can be formed by known methods such as, for example, by CVD methods involving reacting silane and ammonia, with $N_2$ as the diluent, at atmospheric pressure at 700° to 900° C. in a hot- or cold-wall system with an ammonia/silane mole fraction ratio typically being 150 or higher in the case of a hot-wall system, or by reacting dichlorosilane and ammonia at reduced pressure at 700° C. Silicon nitride ($Si_3N_4$) is about 100 times more resistant to thermal oxidation than silicon, which makes it useful as an oxidation mask material, among other things. The silicon dioxide pad layer 11 is used as a buffer for the stress induced by the silicon nitride layer 12 on the substrate 10. The silicon dioxide layer 11 and the silicon nitride layer 12 together constitute the so-called "pad structure" of the trench etch mask 15.

The polysilicon layer 13 on silicon nitride layer 12 is the remainder of a thicker originally-deposited polysilicon layer, the upper part of which having been transformed into polysilicon oxide as described in greater detail below. The polysilicon layer is originally formed in a thickness of about 200 to 400 nm by known methods, such as by CVD methods or by pyrolyzing silane. In the preferred CVD methods, the polysilicon film is deposited and grown on the silicon nitride layer 12, for example, by LPCVD in a hot-wall system by decomposition of silane in a temperature range of about 625°–650° C. at system pressures from 0.25 to 1 torr, to allow uniform growth (±2% across a slice) where the silane gas is typically used in a dilution of about 5–20% for reasons of safety, although higher percentages of silane can be used in some systems.

After the polysilicon layer is formed in its original thickness, the next process step is to subject the polysilicon layer to thermal oxidation to convert an upper stratum of the polysilicon extending from the exposed surface inward into the bulk of the original polysilicon layer into a polysilicon oxide layer 14. The thermal oxidation of the polysilicon can be effected by known methods involving heating the polysilicon at temperatures from 900° to 1,200° C., such as in a quartz diffusion tube, in dry oxygen or water vapor. It is also possible for the thermal oxidation of the polysilicon to be both initiated and concluded in dry oxygen with an intervening wet oxidation step. Steam oxidation at a temperature of about 900° to 1,000° C. is preferred for this thermal oxidation conversion process performed on the polysilicon. The thermal oxidation proceeds substantially uniformly inward through the thickness of polysilicon layer.

The extent of the thermal oxidation effected through the thickness of the original polysilicon layer preferably is not allowed to proceed 100% through the entire original thickness of the polysilicon layer. An adequate thickness of polysilicon oxide needs to be grown to provide an etch mask of sufficient thickness such that some thickness thereof remains after any erosion to complete the RIE etch of the deep trenches in the silicon substrate. Preferably, at least a predominant (i.e., >50%) portion, as measured in the thickness direction, of the polysilicon layer is transformed into polysilicon oxide.

However, the present invention encompasses dry etch formation of relatively high aspect ratio trenches (e.g., aspect ratios greater than 10:1), which makes it difficult to strip off the oxide etch mask layer 14 by conventional wet etch methods alone (e.g. hydrofluoric acid dip) after trench etching. However, since it is difficult to provide favorable dry etch selectivities as between polysilicon oxide and silicon nitride, such as during a dry etch stripping of the thermal oxide etch mask layer after trench formation, it is useful and convenient to leave a portion of the polysilicon layer in its original non-oxidized form as available as a dry etch stop in the later step of removing the polysilicon oxide layer 14 after trench formation. Favorable dry etch chemistries that are selective for thermal oxide relative to polysilicon can be more easily provided. In one preferred arrangement, about 60% to about 80% of the original thickness of polysilicon film is thermally oxidized, leaving underlying about 40% to about 20%, respectively, of the polysilicon thickness as untransformed and available as a dry etch stop during dry stripping of the polysilicon oxide layer. In a more preferred arrangement, approximately 70% of the original thickness of polysilicon film is thermally oxidized leaving underlying approximately 30% of the polysilicon thickness as untransformed. Therefore, polysilicon layer 13 typically remains after the thermal oxidation and it is covered by the overlying polysilicon oxide layer 14 formed.

Upon such formation of the polysilicon oxide layer 14 by thermal oxidation, the composite trench mask structure 15 of the invention is complete and trench etching steps can be performed. For instance, once the composite trench mask structure 15 of this invention is formed with the silicon dioxide layer 11/silicon nitride layer 12/polysilicon layer 13/polysilicon oxide layer 14 mask scheme, the layers of the mask 15 are patterned photolithographically to expose selected surface portions of the trench mask structure 15.

As one suitable example of processing at this point, polysilicon oxide layer 14 is removed at portions left exposed by the patterned photoresist by RIE using a plasma formed from a $CHF_3$ (50 sccm)/argon (60 sccm)/$CF_4$ (15 sccm) source gas at 200 millitorrs pressure and 900 watts power. Then, the polysilicon layer 13 is removed at exposed portions by RIE using a plasma formed from an HBr (40 sccm)/$Cl_2$ (40 sccm) source gas at 100 millitorr pressure and 200 watts power. The silicon nitride layer 12 and silicon dioxide layer 11 can then be removed at exposed portions by the same etch chemistry and conditions as used for polysilicon oxide layer 14 to provide a patterned trench mask structure 15 defining a pattern of exposed surface areas on the substrate 10. The patterned photoresist is then stripped by conventional means.

The patterned etch mask structure 15 is then used to form deep vertical-walled trenches 16 as holes etched into the silicon substrate 10 by an anisotropic etch technique, such as reactive ion etching (RIE). The resulting trench structure is shown in FIG. 1. The trenches 16 formed have vertical or substantially vertical sidewalls 17 and a substantially horizontal bottom surface 18. Reactive ion etching processes capable of providing anisotropic etching of silicon with appropriate etch selectively as between silicon and an oxide (mask) layer are known in the art, such as described, for example, by U.S. Pat. Nos. 4,726,879 (Bondur et al.) and 4,717,448 (Cox et al.) and the references described therein, which are all incorporated herein by reference. A suitable example of a useful anisotropic RIE for forming the trenches in the substrate system is a plasma formed from HBr (60 sccm)/$NF_3$ (10 sccm)/$HeO_2$ (20 sccm) as source gas at 100 millitorr pressure and 700 watts power.

The thermal oxide layer 14, as it turns out, is highly resistant to faceting and the trenches formed using the inventive trench mask structure 15 yield trenches in silicon having high aspect ratios that exceed 10:1 even in sub 0.5 μm geometries.

As a consequence of some physical sputtering action concomitant with the RIE etching of the deep trenches in the silicon, the polysilicon oxide mask layer 14 will incur some erosion loss from its thickness. However, the degree of such sputter loss is substantially uniform through the thickness of the thermal oxide layer 14 including at its mask corners so that significantly reduced faceting occurs despite the overall loss of surface portions of the thermal oxide layer 14.

In any event, the non-eroded remainder of polysilicon oxide layer 14 in the present invention can be stripped and removed after completion of the deep trench etching step and before further processing by a conventional dry etch (e.g., an RIE process) that is preferential to silicon oxide as compared to silicon. Partly as a matter of necessity, it is important that the present invention permits use of dry etching techniques as the primary mode of removal of the polysilicon oxide layer 14 after the trench etching. This is because the exclusive use of conventional wet etches, such as a conventional buffered hydrofluoric acid dip, for this purpose would pose serious problems in terms of the wet etchant undercutting the nitride layer 12 at the pad oxide layer 11 during a prolonged wet etch time that would be required (due to the deep trench environment of the present invention). In the present invention, after trench formation, the remainder of polysilicon oxide layer 14 is removed first and primarily by dry etch. For example, the polysilicon oxide layer 14 can be removed by RIE using a plasma formed from a CHF$_3$ (50 sccm)/argon (60 sccm)/CF$_4$ (15 sccm) source gas at 200 millitorrs pressure and 900 watts power.

Then, in a follow-up step, to ensure removal of any residue of the oxide layer 14 still remaining and also to remove any oxide residue inadvertently formed in the trenches during the proceeding dry etching operations, a reduced buffered hydrofluoric acid dip etch is preferably performed for a relatively brief period of time (e.g., for a duration of only about 10 to 60 seconds), which generally is at least 50% less than the time that would be otherwise needed for the wet HF etch in the absence of the preliminary dry etch of the mask.

The adaption of dry stripping techniques for primary removal of the polysilicon oxide etch mask after trench formation represents an important advantage as the present invention in that nitride pad lift-off problems can be avoided.

After stripping the polysilicon oxide layer 14, the polysilicon layer 13, in turn, is also removed by any conventional process. Preferably, polysilicon layer 13 is removed at this stage of processing chemical-mechanical polishing, such as described in U.S. Pat. 4,671,851, which is incorporated herein by reference.

Although the present invention is not particularly concerned with post-processing of the trenches, once formed, suffice it to say that the high aspect ratio trenches formed in the silicon substrate by the invention can then be filled by dielectric material or device-forming material according to conventional processes. The resulting narrow, high resolution filled trenches can be used to advantage, for example, as device isolation trenches in integrated circuit manufacture and in DRAM products for trench capacitor storage.

Again, an important feature of the present invention is the use of a thermal oxide RIE etch mask in forming deep trenches in silicon, and the use of this thermal oxide etch mask in conjunction with an oxide/nitride pad sub-structure.

Figure 2:
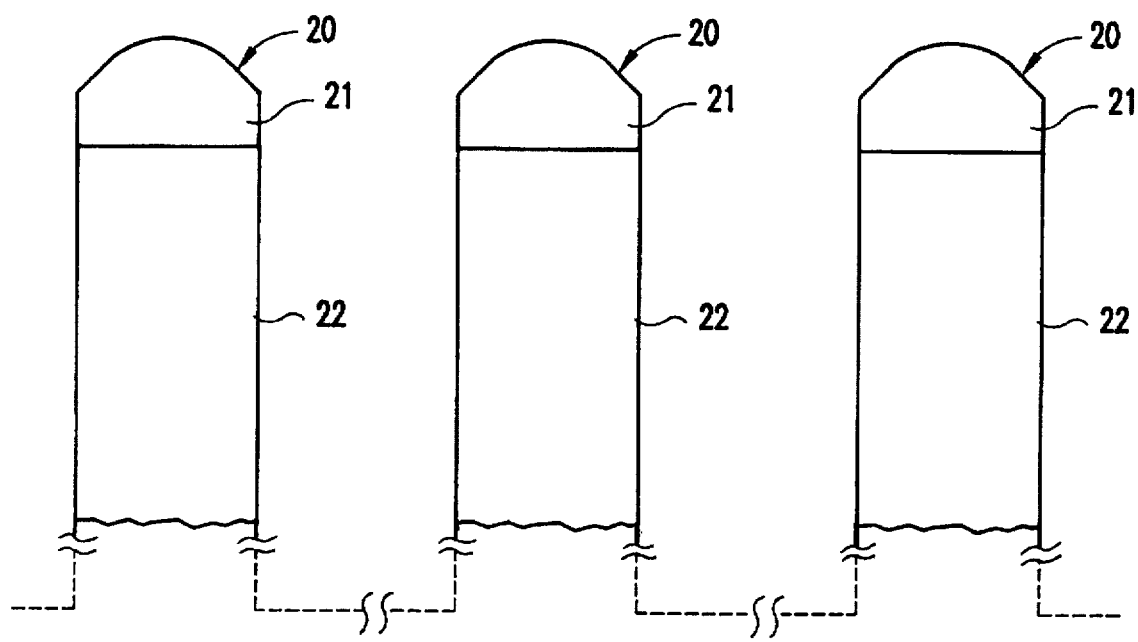
FIG. 2 illustrates in cross-sectional representation a portion of a comparative RIE etch mask using a CVD oxide mask after its use in forming deep trenches in silicon.
Figure 3:
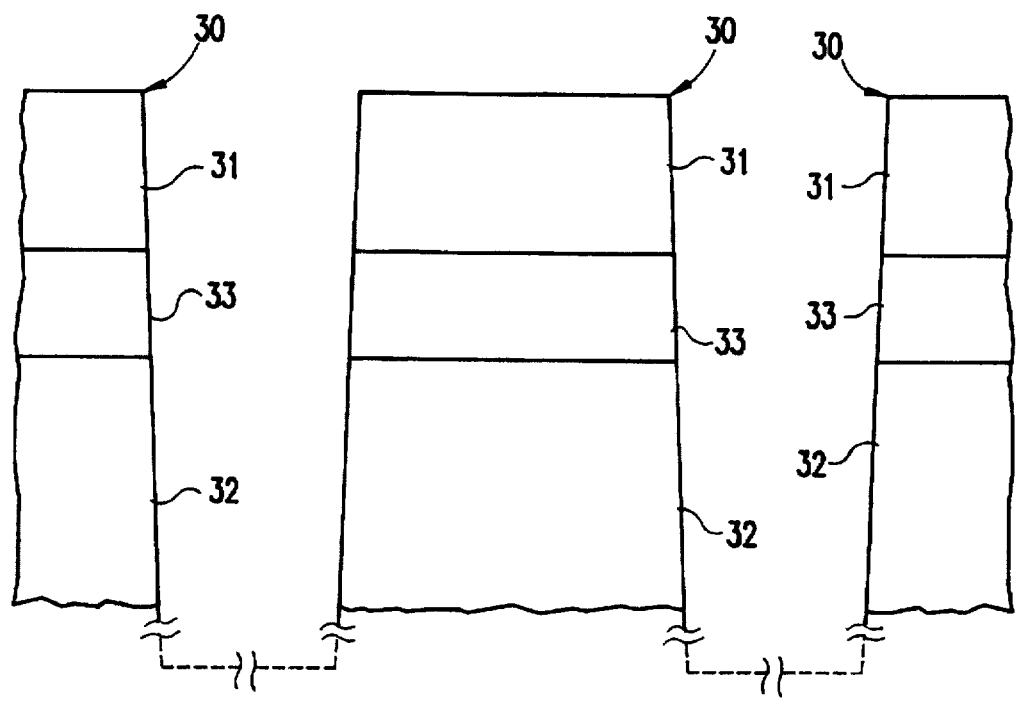
FIG. 3 illustrates in cross-sectional representation a portion of an RIE etch mask of the invention using a thermal oxide mask after its use in forming deep trenches in silicon.

It has been found that a thermal polysilicon oxide is significantly more resistant to the faceting affects of a deep trench RIE process as compared, for example, to a CVD oxide mask layer. FIG. 3 is an illustration depicting observations made via SEM photomicrographs (30,000×) of a polysilicon oxide layer 31, a polysilicon layer 33, and a silicon nitride layer 32 portion of the etch mask upon completion of etching of deep trenches in a silicon substrate (not shown). The silicon substrate and silicon oxide pad layer were also used but are not shown in FIG. 3 for sake of simplicity. The corners 30 of the thermal oxide mask 31 remained sharp and right angled after deep trench etching. In contrast, FIG. 2 is an illustration depicting observations also made via SEM photomicrographs (30,000×) of a CVD oxide mask 21 and silicon nitride layer 22 portion of an etch mask upon completion of RIE etching of deep trenches in a silicon substrate (not shown) under the same conditions as that of FIG. 3 except for the differences in the type of oxide etch mask. The silicon oxide pad layer was also used but is not shown in FIG. 2 for sake of simplicity. The corners 20 of the CVD oxide mask 21 incurred pronounced faceting (beveling) as a result of the RIE etch of the trenches.

While the invention has been described in terms of its preferred embodiments, those skilled in the art will recognize that the invention can be practiced with modification within the spirit and scope of the appended claims.

We claim:

1. A method for forming a trench in a semiconductor substrate, comprising the steps of:

(a) providing a semiconductor substrate having a surface;

(b) forming a polysilicon layer on said semiconductor surface;

(c) forming a polysilicon oxide layer on said polysilicon layer;

(d) patterning said polysilicon oxide layer and said polysilicon layer to form at least one opening extending through exposed opposing side faces of said polysilicon oxide layer and said polysilicon layer, and said opening exposing a portion of said semiconductor surface; and (e) etching said semiconductor substrate through said opening to form a trench extending into said substrate from said semiconductor surface.

2. The method of claim 1, wherein said etching of said semiconductor substrate comprises forming a groove with anisotropic etching.

3. The method of claim 2, wherein said anisotropic etching comprises a reactive ion etching selective for silicon.

4. A method for forming a trench in a semiconductor substrate, comprising the steps of:

(a) providing a semiconductor substrate having a surface;

(b) forming a polysilicon layer on said semiconductor surface;

(c) forming a polysilicon oxide layer on said polysilicon layer;

(d) patterning said polysilicon oxide layer and said polysilicon layer to form at least one opening therethrough exposing a portion of said semiconductor surface; and (e) etching said semiconductor substrate through said opening to form a trench extending into said substrate from said semiconductor surface, wherein said trench has an aspect ratio greater than 10:1.

5. A method for forming a trench in a semiconductor substrate, comprising the steps of:

(a) providing a semiconductor substrate having a surface;

(b) forming a polysilicon layer on said semiconductor surface;

(c) forming a polysilicon oxide layer on said polysilicon layer;

(d) patterning said polysilicon oxide layer and said polysilicon layer to form at least one opening therethrough exposing a portion of said semiconductor surface; and (e) etching said semiconductor substrate through said opening to form a trench extending into said substrate from said semiconductor surface, wherein said trenches have width openings of less than 0.5 μm.

6. The method of claim 1, wherein said semiconductor substrate is monocrystalline silicon.

7. A method for forming trenches in a semiconductor substrate, comprising the steps of:

(a) providing a semiconductor substrate having a surface;

(b) forming a silicon dioxide layer on said semiconductor surface;

(c) forming a silicon nitride layer on said silicon dioxide layer;

(d) forming a polysilicon layer on said silicon nitride layer;

(e) forming a polysilicon oxide layer on said polysilicon layer;

(f) patterning all of said polysilicon oxide layer, said polysilicon layer, said silicon nitride layer and said silicon dioxide layer to form a pattern of sub-micron width openings therethrough exposing portions of said semiconductor surface; and (g) etching said semiconductor substrate through said openings to form trenches extending into said substrate from said semiconductor surface.

8. The method of claim 7, wherein said etching of said semiconductor substrate comprises forming a groove with anisotropic etching.

9. The method of claim 8, wherein said anisotropic etching comprises a reactive ion etching selective for silicon.

10. The method of claim 7, wherein said trenches has an aspect ratio greater than 10:1.

11. The method of claim 7, wherein said sub-micron width openings each are less than 0.5 μm.

12. The method of claim 7, wherein said semiconductor substrate is monocrystalline silicon.

13. The method of claim 7, wherein said step (e) of forming said polysilicon oxide layer on said polysilicon layer comprises thermally oxidizing a portion of said polysilicon layer formed in step (d).

14. The method of claim 13, wherein said polysilicon layer is formed with an original thickness in step (d) and said thermal oxidizing of said polysilicon layer extends through approximately 70% of said original thickness of said polysilicon layer.

15. The method of claim 13, wherein said thermal oxidizing comprises subjecting said polysilicon layer to steam oxidation at a temperature of about 900° to 1,000° C.

16. Method for forming deep trenches in a semiconductor substrate, comprising the steps of:

depositing a first polysilicon layer having a first thickness on a semiconductor substrate;

thermally oxidizing at least a predominant portion but not all of said first polysilicon layer to form a polysilicon oxide layer thereby leaving a second polysilicon layer with a second thickness; said second thickness of said second polysilicon layer being less than said first thickness of said first polysilicon layer;

patterning said polysilicon oxide layer and said second polysilicon layer to form a pattern of sub-micron width openings extending through exposed opposing side faces of said polysilicon oxide layer and said second polysilicon layer, and said openings exposing portions of a surface of said semiconductor substrate; and anisotropically etching said semiconductor surface through said openings to form trenches having sub-micron width openings, said trenches extending into said substrate from said semiconductor surface.

17. The method of claim 16, wherein said trenches has an aspect ratio greater than 10:1.

18. The method of claim 16, wherein said trenches have width openings of less than 0.5 μm.

19. The method of claim 16, wherein said second thickness of said second polysilicon layer is approximately 30% of said first thickness of said first polysilicon layer.

\* \* \* \* \*